United States Patent
Demura et al.

(10) Patent No.: US 11,414,746 B2
(45) Date of Patent: Aug. 16, 2022

(54) FILM FORMING APPARATUS AND FILM FORMING METHOD USING THE SAME

(71) Applicant: CANON KABUSHIKI KAISHA, Tokyo (JP)

(72) Inventors: Kazuya Demura, Tokyo (JP); Takamasa Horie, Kawasaki (JP); Hiroyuki Kobayashi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 450 days.

(21) Appl. No.: 16/453,730

(22) Filed: Jun. 26, 2019

(65) Prior Publication Data

US 2020/0002806 A1 Jan. 2, 2020

(30) Foreign Application Priority Data

Jul. 2, 2018 (JP) .............................. JP2018-126321

(51) Int. Cl.
  *C23C 14/34* (2006.01)
  *C23C 14/54* (2006.01)
  *H01J 37/34* (2006.01)
  *C23C 14/50* (2006.01)

(52) U.S. Cl.
  CPC ........ *C23C 14/3407* (2013.01); *C23C 14/505* (2013.01); *C23C 14/54* (2013.01); *H01J 37/3417* (2013.01); *H01J 37/3455* (2013.01)

(58) Field of Classification Search
  CPC .............. C23C 14/3464; C23C 14/225; C23C 14/3407; C23C 14/54
  USPC ....................................... 204/298.21, 298.22
  See application file for complete search history.

(56) References Cited

U.S. PATENT DOCUMENTS

| 5,108,574 A * | 4/1992 | Kirs .................... H01J 37/3441 |
| | | 204/192.12 |
| 5,626,727 A * | 5/1997 | Yamanishi .......... H01J 37/3405 |
| | | 204/192.12 |
| 8,137,510 B2 * | 3/2012 | Bangert .............. H01J 37/3405 |
| | | 204/192.12 |
| 2009/0178916 A1 * | 7/2009 | Kloeppel .............. C23C 14/352 |
| | | 204/192.12 |
| 2009/0277778 A1 | 11/2009 | Stowell |
| 2015/0187549 A1 * | 7/2015 | Kitada .................... C23C 14/35 |
| | | 204/298.16 |

FOREIGN PATENT DOCUMENTS

| CN | 2656432 Y | 11/2004 |
| CN | 1611631 A | 5/2005 |
| CN | 104350173 A | 2/2015 |
| CN | 104364417 A | 2/2015 |
| CN | 104878356 A | 9/2015 |
| CN | 107250427 A | 10/2017 |

(Continued)

*Primary Examiner* — John J Brayton
(74) *Attorney, Agent, or Firm* — Canon U.S.A., Inc. IP Division

(57) ABSTRACT

A film forming apparatus includes a base material support mechanism configured to rotate a base material supported by the base material support mechanism about a first axis, and a first cathode portion on which a target in a cylindrical shape containing a film forming material is mounted and configured to rotate the target about a second axis, in a chamber. The second axis is disposed at a position skewed with respect to the first axis.

20 Claims, 9 Drawing Sheets

(56) References Cited

FOREIGN PATENT DOCUMENTS

| | | |
|---|---|---|
| JP | 2002220664 A | 8/2002 |
| JP | 2013256707 A | 12/2013 |
| WO | 2017182081 A1 | 10/2017 |

* cited by examiner

FILM FORMING APPARATUS AND FILM FORMING METHOD USING THE SAME

BACKGROUND OF THE INVENTION

Field of the Invention

The present invention relates to a film forming apparatus that uses a sputtering method and, more particularly, to a film forming apparatus suitable for film formation on a lens having a concave surface or convex surface with a large half-aperture angle.

Description of the Related Art

In recent years, lenses of cameras have had a wider angle, and lenses having a concave surface or convex surface with a large half-aperture angle (angle formed by the optical axis of a lens and the normal to the concave surface or convex surface of the lens within the effective diameter) are widely employed as lenses that are components of the optical systems of the cameras. In such wide-angle lenses, to achieve improvement in transmittance and reduction of ghosting flare, the film thickness of an antireflection film within the lens surface is uniformly formed.

Japanese Patent Laid-Open No. 2013-256707 describes a film forming apparatus. The film forming apparatus includes a lens holder and a planar target. The lens holder is rotatable about its rotary shaft, and is able to hold a plurality of lenses. The planar target is supported in a chamber in an inclined state relative to the rotary shaft of the lens holder. The rotary shaft of the lens holder is connected to an actuator unit having a pivot shaft and a telescopic shaft, and is able to adjust a distance to the target and a relative angle with respect to the target. A plurality of lenses having a concave surface is set in the lens holder, a cover member for adjusting the film thickness of a film that adheres to the concave surface covers the concave surfaces of the lenses, and film formation is performed while the relative distance and relative angle between the lens holder and the target are adjusted. Thus, the film thickness in each concave surface is made uniform.

SUMMARY OF THE INVENTION

However, with the film forming apparatus of Japanese Patent Laid-Open No. 2013-256707, there is inconvenience that the lens surface on which a film having a uniform film thickness is formed is limited to a concave surface.

According to an aspect of the present invention, a film forming apparatus is provided that is able to form a film with less variations in film thickness within a lens surface having a large half-aperture angle irrespective of whether the lens surface is a concave surface or a convex surface.

In accordance with another aspect of the present invention, a film forming apparatus includes in a chamber a base material support mechanism configured to rotate a base material supported by the base material support mechanism about a first rotation axis, and a first cathode portion configured to rotate a target in a first cylindrical shape about a second rotation axis; and a second cathode portion configured to rotate a target in a second cylindrical shape about a third rotation axis. The second rotation axis and the third rotation axis are disposed at positions skewed with respect to the first rotation axis, a relation of Ma<Mb is satisfied, where Ma is a distance between the second rotation axis and a base material support surface of the base material support mechanism in a direction in which the first rotation axis extends and Mb is a distance between the third rotation axis and the base material support surface of the base material support mechanism in the direction in which the first rotation axis extends, and a relation of La>Lb is satisfied, where La is a distance between the first rotation axis and the second rotation axis when viewed in the direction in which the first rotation axis extends and Lb is a distance between the first rotation axis and the third rotation axis when viewed in the direction in which the first rotation axis extends.

Further features of the present invention will become apparent from the following description of exemplary embodiments with reference to the attached drawings.

DESCRIPTION OF THE EMBODIMENTS

Hereinafter, exemplary embodiments of the invention will be described with reference to the accompanying drawings. The dimensions, materials, shapes, relative arrangements, and the like, of components, the procedures, control parameters, target values, and the like, of various control operations, which will be described in the following embodiments, are not intended to limit the scope of the invention only thereto unless otherwise specified.

First Embodiment

Figure 1A:
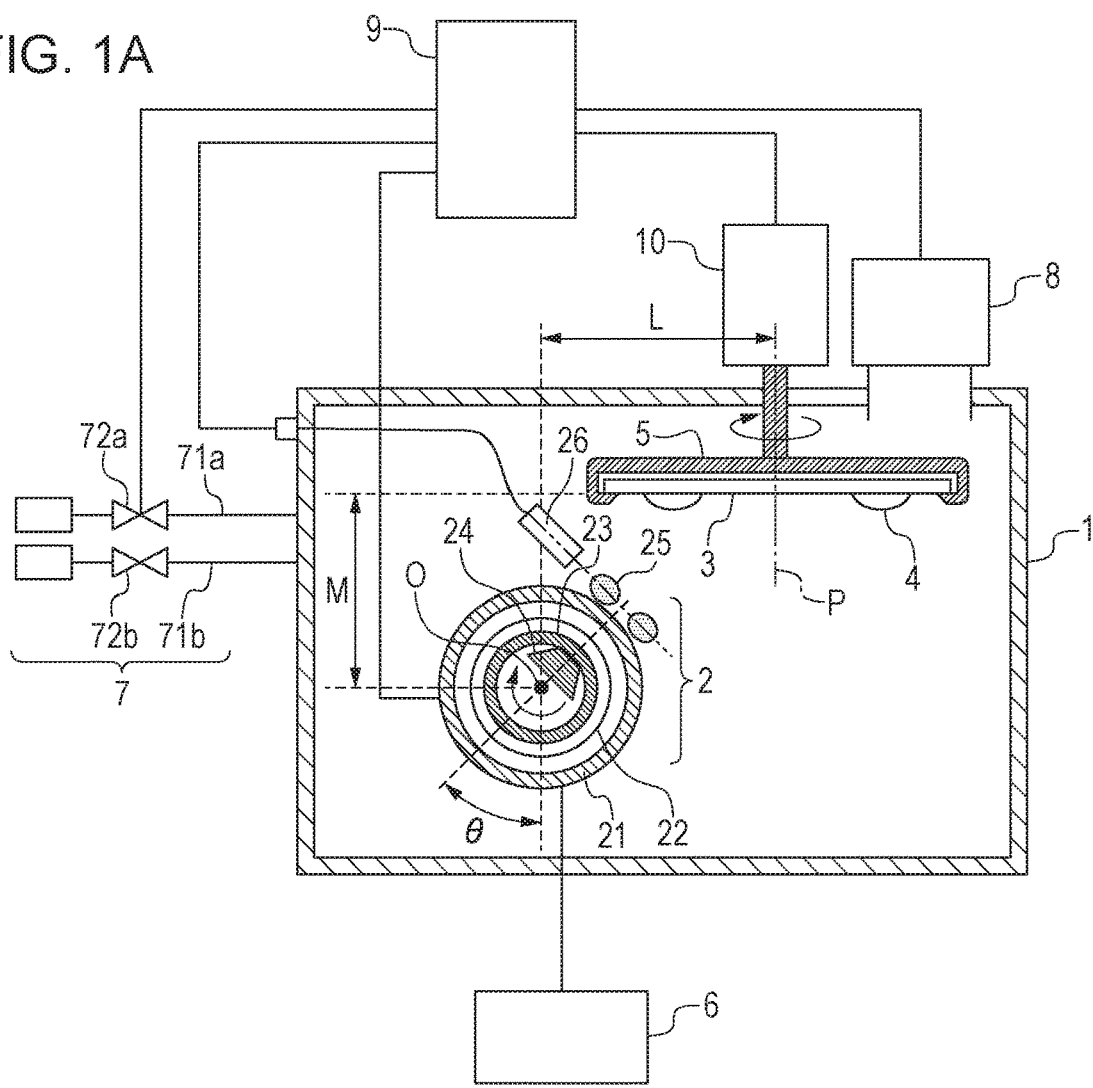
FIG. 1A is a sectional view illustrating the schematic configuration of a film forming apparatus according to a first embodiment.

FIG. 1A is a sectional view, in a vertical direction, of the schematic configuration of a film forming apparatus. The film forming apparatus includes a cathode portion 2 and a chucking (base material support mechanism) 5 inside a chamber 1. A target 21 that emits a film forming material is mounted on the cathode portion 2. The chucking 5 supports a film-formed base material (hereinafter, referred to as base material) 4. The chucking 5 can be rotated about a rotation axis P by a rotating mechanism 10. The film forming apparatus further includes a power supply 6, a gas supply unit 7, an exhaust device 8, and a controller 9. The power supply 6 supplies electric power to the cathode portion 2. The gas supply unit 7 supplies process gas. The exhaust device 8 is connected to the chamber 1. The controller 9 controls the operation of the film forming apparatus.

The chamber 1 can be hermetically sealed and is able to keep the inside of the chamber 1 in a negative pressure state by exhausting gas inside with the exhaust device 8. The pressure in the chamber 1 can be adjusted through control over the amount of gas that is supplied from the gas supply unit 7 and exhaust by the exhaust device 8.

In FIG. 1A, the gas supply unit 7 includes a process gas supply line 71a and a reactive gas supply line 71b. The process gas may be any gas that is able to supply ions used for sputtering. Ar gas is widely used as the process gas. Reactive gas is supplied when so-called reactive sputtering, that is, sputtering in reactive mode or transition mode, is performed. For example, when film formation is performed while a target material is oxidized, $O_2$ gas is supplied as reactive gas. For a device that does not perform reactive sputtering, the reactive gas supply line 71b may be omitted. Alternatively, when a film is formed on the base material 4 and subsequently the film undergoes a reaction, for example, an oxidation reaction, a supply port of the reactive gas supply line 71b may be disposed near the base material 4, and supply gas containing oxygen radicals. The amounts of gases supplied are adjusted through control over flow rates with valves 72a, 72b of the gas supply unit 7.

The chucking 5 is placed at the top of the chamber 1, and has a structure that supports the base material 4 together with the base material holder 3 parallel to the top. By employing such a structure, the base material 4 can be set in the base material holder 3 in advance outside and then the base material 4 together with the holder 3 can be put into the chamber 1 through a transfer port (not shown) and set in a film forming position, so workability is good. The chucking 5 is not limited to having the configuration that supports the base material 4 via the base material holder 3. The chucking 5 may have a configuration that directly supports the base material 4. In the drawing, the chucking 5 supports a plurality of base materials 4 and is configured to cause the base materials 4 to revolve around the rotation axis P. Alternatively, the chucking 5 may support a single base material 4, and may be configured to cause the base material 4 to rotate or revolve about the rotation axis P. The configuration that the chucking 5 causes the plurality of base materials 4 to revolve about the rotation axis P allows film formation on the plurality of base materials 4 at a time and high material efficiency and high film formation efficiency, so the above configuration is particularly desirable.

The chucking 5 is connected to the rotating mechanism 10 and can be rotated about the rotation axis P (first rotation axis). To assist the chucking 5 that supports the base material holder 3, a mechanism of raising or lowering the chucking 5 or pivoting the chucking 5 may be added to the rotating mechanism 10.

The cathode portion 2 is connected to an actuator mechanism (not shown) and can be rotated about an axis O (second rotation axis) at a position spatially skewed with respect to the rotation axis P of the chucking 5. The cathode portion 2 is a so-called rotary cathode. The target 21 is mounted on the cathode portion 2. The target 21 is bonded to the surface of a cylindrical backing tube 22. The cathode portion 2 includes a magnet case shaft 23 at a position where the magnet case shaft 23 is covered with the backing tube 22. The magnet case shaft 23 is rotatable about the axis O. A magnet 24 is placed inside the magnet case shaft 23. When the magnet case shaft 23 is turned, the relative position between the magnet 24 and the base material 4 is changed. The magnet 24 includes a pair of magnets having mutually different polarities. A magnetic field is generated by the magnet 24 on the surface of the target 21. Plasma 25 is attracted by the magnetic field toward the surface of the target 21, and an erosion region, where the film forming material is emitted the most, is formed on the target surface. When the pair of magnets having mutually different polarities is disposed such that the erosion region is formed in a ring shape, electrons for ionizing sputtered gas are held on the target surface, so film formation is efficiently performed. When reactive sputtering is performed, PEM control is executed. In PEM control, the flow rate of reactive gas is adjusted while the intensity of emission of plasma generated near the target 21 is monitored with a plasma emission monitor (PEM) 26. The intensity of emission detected by the PEM 26 is sent to the controller 9. The controller 9 adjusts the flow rate of reactive gas such that the intensity of emission becomes a set value. The PEM 26 is placed at a position as close as possible to plasma where the PEM 26 is able to detect the intensity of emission of plasma without interference with film formation. The PEM 26 is provided, for example, so as to be able to monitor at least plasma in the center area of a target. Depending on the length of a target in the direction of the rotation axis, it is desirable that a plurality of PEMs 26 be provided so that plasma is monitored even at an end.

The backing tube 22 and the magnet case shaft 23 are rotatable about the axis O. The rotations of the backing tube 22 and magnet case shaft 23 are controlled independently of each other.

The power supply 6 is connected to the cathode portion 2. The cathode portion 2 is able to supply the target 21 with electric power for generating a plasma discharge. A DC or DC-pulse power supply is used as the power supply 6. The cathode portion 2 has a cooling structure for cooling the target 21 to suppress an increase in the temperature of the target surface due to plasma discharge generated on the surface of the target 21.

Figure 1B:
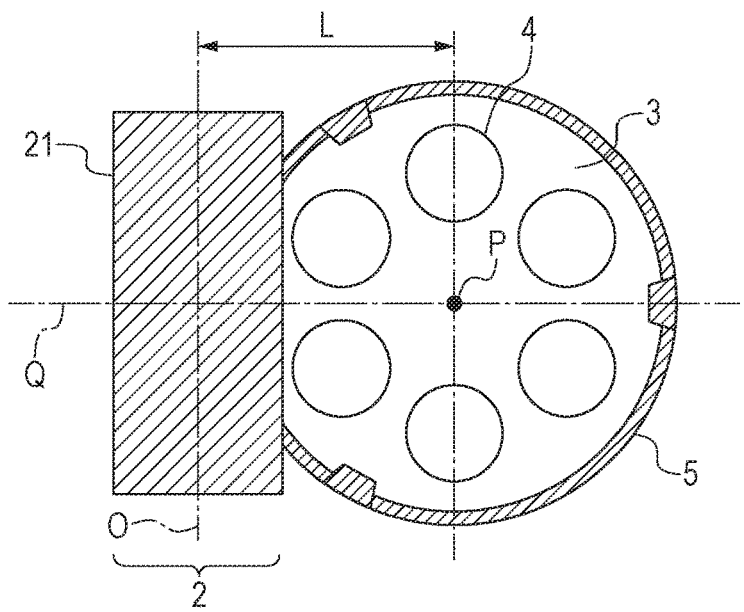
FIG. 1B is a view illustrating a cathode portion and a base material holding side of a chucking when viewed in a direction along a rotation axis P.
Figure 2:
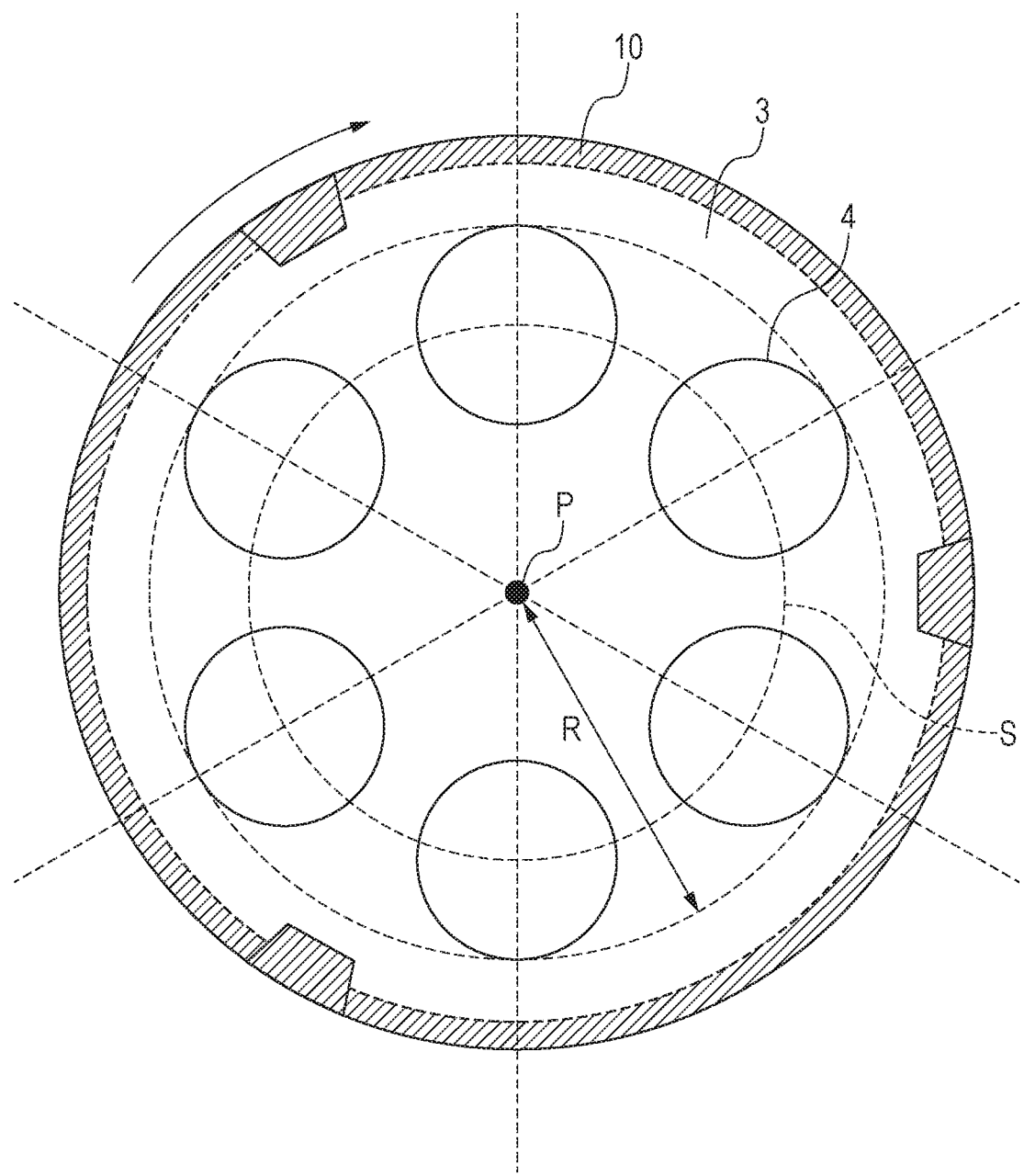
FIG. 2 is a view of a base material holder supported by the chucking when viewed in a direction along the rotation axis P.

FIG. 1B is a view illustrating the positional relationship between the chucking 5 and the region where the target 21 is mounted on the cathode portion 2 when the cathode portion 2 and the base material holding side of the chucking 5 are viewed from a film-formed surface side of the base material holder 3. FIG. 2 is a view of an example of the base material holder 3 supported by the chucking 5 when viewed from the film-formed surface side. Six base materials 4 are mounted on the base material holder 3 at equiangular positions about the rotation axis P. In the case of FIG. 2, points farthest from the rotation axis P within the film-formed surfaces of the base materials 4 supported by the chucking 5 draw a circle of a radius R as indicated by the dashed line.

The cathode portion 2 is provided at a position where a center line Q of the width, in a direction in which the rotation axis O extends, of the target mounted region passes through the rotation axis P of the chucking 5 and the rotation axis O of the cathode portion 2 is shifted from the rotation axis P of the chucking 5. When L represents the amount of shift of the rotation axis O of the cathode portion 2 from the rotation axis P of the chucking 5, the amount of shift L is, for example, greater than or equal to the radius R of the circle drawn by the points farthest from the rotation axis P within the film-formed surfaces of the base materials 4 supported by the chucking 5. It is more desirable that the amount of shift L be greater than or equal to 1.4 times as great as the radius R of the circle drawn by the points farthest from the rotation axis P within the film-formed surfaces of the base materials 4 supported by the chucking 5.

When the amount of shift L is greater than the radius R, uniformity of the film thickness on the surface of each base material 4 with a large half-aperture angle is easily achieved. However, a film formation rate decreases when the rotation axis O is too far from the rotation axis P, so it is desirable that the amount of shift L be less than or equal to 2R.

Figure 3:
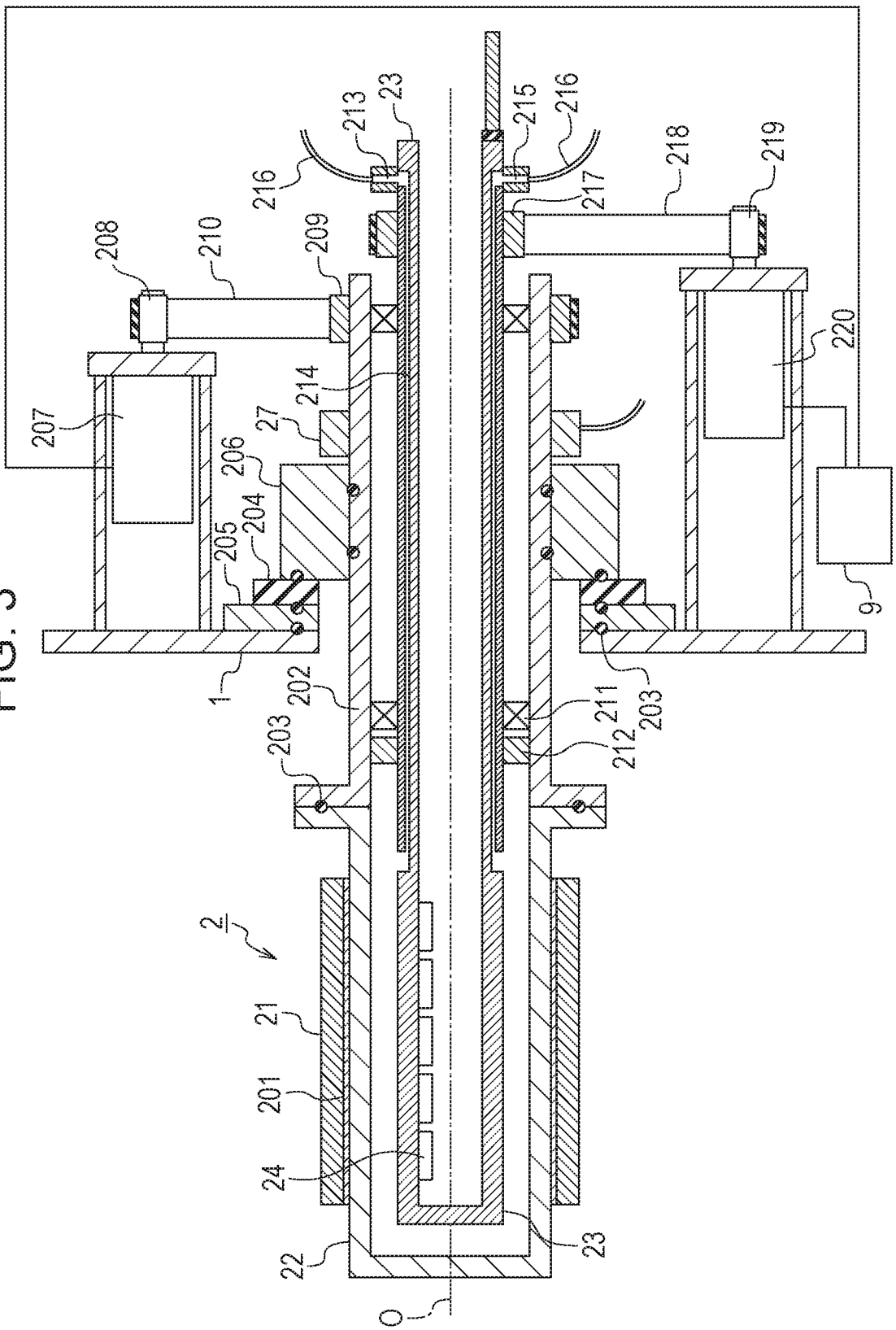
FIG. 3 is a schematic sectional view, taken along a rotation axis O, of the whole cathode portion.

Next, the detailed structure of the cathode portion 2 will be described. FIG. 3 is a schematic sectional view, taken along the rotation axis, of the whole cathode portion 2.

The target 21 is supported so as to be bonded to the backing tube 22 by a bonding material 201, such as indium. The backing tube 22 is a cup-shaped cylinder whose one end is closed and the other end has a flange shape so that the backing tube 22 can be fixed to a target rotation shaft 202 by bolts (not shown). The backing tube 22 and the target rotation shaft 202 are fixed to each other with an O-ring 203 interposed therebetween. The space inside the backing tube 22 is isolated from the environment in the chamber 1. When a film forming material is changed, the target 21 is replaced together with the backing tube 22.

The target rotation shaft 202 is held by a magnetic fluid seal 206 attached to a base plate 205 via an electrically insulating member 204. The target rotation shaft 202 is rotatable by a bearing(s) incorporated in the magnetic fluid seal 206. An O-ring 203 is disposed between any adjacent two of the chamber 1, the base plate 205, the electrically insulating member 204, the magnetic fluid seal 206, and the target rotation shaft 202. A vacuum environment inside the chamber 1 and an outside atmospheric environment are isolated from each other.

A slip ring 27 is mounted on the target rotation shaft 202, and supplies the target 21 with electric power used for sputtering via the target rotation shaft 202 and the backing tube 22. In the present embodiment, the slip ring 27 is provided in the atmospheric environment, and supplies electric power to the rotating target 21. Alternatively, a slip ring may be mounted at the distal end of the backing tube 22 in the vacuum environment, and supply electric power. In this case, electric power is introduced into the chamber 1 via a current introduction terminal.

A driven pulley 209 is provided on the target rotation shaft 202. A drive pulley 208 is provided for a rotary motor 207 for a target. The driven pulley 209 is connected to the drive pulley 208 via a timing belt 210. Thus, the rotation of the rotary motor 207 is transmitted to the target rotation shaft 202, and the target rotation shaft 202 is rotated. To prevent current flowing through the target rotation shaft 202 from flowing into the rotary motor 207 at the time of sputtering, a rubber belt is used as the timing belt 210 to electrically insulate the target rotation shaft 202 and the rotary motor 207 from each other.

The magnet case shaft 23 is a cylindrical member, on the inner wall surface of which the magnet 24 is placed. When the position of the magnet 24 is changed by turning the magnet case shaft 23, the relative positional relationship between the base material 4 and plasma that is generated on the surface of the target 21 is adjusted. The magnet case shaft 23 is supported by a rotary bearing 211 such that the distance from the backing tube 22 is maintained. Space for circulating coolant is defined between the magnet case shaft 23 and the backing tube 22 by a mechanical seal 212. Coolant introduced through a coolant introduction port 213 provided at an end of the magnet case shaft 23 can be supplied to the space through a flow passage 214. Coolant supplied to the space between the backing tube 22 and the magnet case shaft 23 is drained through a coolant drain port 215 provided at the end of the magnet case shaft 23. Coolant is guided by a resin tube 216 to the coolant introduction port 213 or the coolant drain port 215. With such a structure, the bonding material 201 and the target 21 are cooled via the backing tube 22, and an increase in the temperature of the bonding material 201 due to the energy of sputtering is suppressed. As a result, a drop-off of the target 21 from the backing tube 22 due to melting of the bonding material 201 is prevented. A chiller having a temperature adjustment function may be used as a source from which coolant is supplied.

The magnet case shaft 23, different from the target rotation shaft 202, need not be rotatable but, in this embodiment, is preferably able to turn within a predetermined angular range. For example, when the magnet case shaft 23 is made turnable within an angular range of 180 degrees, coolant is introduced into the target rotation shaft 202 by disposing and routing the resin tube 216 inside Cableveyor® (not shown). When the target rotation shaft 202 is rotated, coolant can be introduced or drained when a rotary joint is provided at a coolant introduction portion.

When tap water or industrial water is used as coolant, the resistance value is not sufficiently high. Therefore, current may leak through the coolant, and the voltage at the surface of the target 21 may be insufficiently obtained, with the result that plasma may be not generated. In such a case, the length and diameter of the resin tube 216 are adjusted according to the resistance of coolant. Thus, the electric resistance of coolant flowing through the resin tube 216, that is, current leakage path, should be adjusted so as to fall within an allowable range.

A driven pulley 217 is provided on the magnet case shaft 23. A drive pulley 219 is provided for a rotary motor 220 for actuating the magnet. The driven pulley 217 is connected to the drive pulley 219 via a timing belt 218. Thus, the rotation of the rotary motor 220 is transmitted to the magnet case shaft 23, and the magnet case shaft 23 is rotated. To prevent current flowing through the magnet case shaft 23 from flowing into the rotary motor 220 at the time of sputtering, a rubber belt is used as the timing belt 218 to electrically insulate the magnet case shaft 23 and the rotary motor 220 from each other.

It is desirable that the timing belt 218 and the timing belt 210 be disposed symmetrically with respect to the rotation axis O. With this disposition, excessive offset load due to the initial tension of the belts on the magnetic fluid seal 206 supporting the target rotation shaft 202 is reduced.

Next, the procedure of adjusting the position of the magnet will be described. An optimal position of the magnet 24 to form a uniform film on the base material 4 is calculated based on a database created in advance, the magnet 24 is moved to the calculated position and locked, and then film formation is performed. Thus, a further uniform film is formed. The procedure of adjusting the position of the magnet is similarly performed in other embodiments.

First, with a similar technique to that of Japanese Patent Laid-Open No. 2002-220664, the emission angle distribution of sputtered particles that are emitted from the target is obtained. Specifically, in a device that is used in film formation, a measurement base material, having a known shape, and a target are disposed in a predetermined positional relationship, film formation is actually performed, and a film thickness distribution of a film formed on the measurement base material is measured. Thus, the emission angle distribution of sputtered particles that are emitted from the target is acquired. Based on the acquired emission angle distribution of sputtered particles, simulations are performed on the inclination angle of the magnet 24 and the film thickness distribution of a film that adheres to the base material 4 in the shape and disposition of the film-formed surface of the base material 4 that is used in film formation and the positional relationship between the chucking 5 and the cathode portion 2. The inclination angle of the magnet 24 suitable for achieving a uniform film thickness distribution is obtained by changing the inclination angle of the magnet 24.

The inclination angle of the magnet 24 is defined as an angle θ formed by, when viewed in a direction in which the rotation axis O extends, a center line of the magnet 24 in the turning direction of the magnet 24 (center line in the width direction) and a direction in which the first rotation axis extends (reference direction)

The obtained relationship between the shape and disposition of the base material 4 and the inclination angle of the magnet 24 suitable for achieving a uniform film thickness distribution is saved in a recording device that the controller 9 is able to access, and the controller 9 consults the relationship when the controller 9 selects the inclination angle of the magnet 24 at the time of actual film formation. When simulation results under various device configurations and film formation conditions are recorded as a database, machine learning can be performed for base materials having various film formation conditions and various shapes. In this case, even when the configuration of the film forming apparatus or the film formation condition changes, the inclination angle of the magnet 24, which provides a film with less variations in film thickness, can be obtained without any preparation in advance.

At the time of film formation on the base material 4, information about the film-formed surface, used to select the inclination angle of the magnet 24, is input to the controller 9. Information about the film-formed surface, for example, when the base material 4 is a lens, includes whether the film-formed surface is a concave surface or a convex surface, the half-aperture angle of the film-formed surface, the diameter (or radius) of the lens, and the disposition of the lens. These pieces of information should be input by a user through an input portion of the controller 9 in accordance with an input page that is displayed on a display unit of the controller 9.

The controller 9 accesses the database saved in the recording device upon receiving input from the user, and selects the inclination angle of the magnet 24 suitable for the film-formed surface having the input shape from the database. The controller 9 converts the selected inclination angle to a rotation angle from the origin of an encoder that a magnet rotary motor 220 includes, transforms the rotation angle into a command value for driving the magnet rotary motor 220, and transmits the command value to the magnet rotary motor 220. The magnet rotary motor 221 drives the motor in accordance with the received command value, adjusts the magnet 24 to a predetermined position, and locks the magnet 24. Inclination angles may be converted to command values of the motor 221 in advance and recorded as a database.

When the position of the magnet 24 is determined, the base material 4 is set as in the case of the related art, and film formation is performed by applying voltage while rotating the target as a result of rotating the cathode portion 2.

Initially, the base material 4 is mounted on the base material holder 3, and then the base material holder 3 is supported by the chucking 5. The base material holder 3 has a configuration that at least one base material 4 can be mounted. When the base material 4 is a lens with a concave surface or a convex surface and a single lens (base material) 4 is mounted, the central axis of the lens 4 may be brought into coincidence with the rotation axis P of the chucking 5 or may be disposed so as to be shifted from the rotation axis P. However, when a plurality of lenses 4 is mounted, the central axes of all the lenses 4 to be mounted are disposed so as to be shifted from the rotation axis P as illustrated in FIG. 2. Particularly, it is desirable that the central axes of all the lenses 4 to be mounted be disposed at the equal distance from the rotation axis P.

A holder of a type that has an opening smaller than the base material 4 to be mounted and the base material 4 is fitted to the opening to be mounted may be used as the base material holder 3. It is desirable that an edge portion of the opening be chamfered because interruption of incoming particles of a target material onto the film formation surface of the film-formed base material 4 due to the thickness of the base material holder 3 is reduced.

The base material holder 3 is set in the chucking 5, then, the chamber 1 is hermetically sealed, and air in the chamber 1 is exhausted with the exhaust device 8. The chucking 5 is rotated about the rotation axis P at appropriate timing. When air in the chamber 1 has been exhausted up to a desired degree of vacuum, process gas is introduced from the gas supply unit 7, plasma is generated on the surface of the target 21 by applying voltage to the cathode portion 2, and sputtering is performed until a film having a desired film thickness is formed on the surface of the base material 4.

Second Embodiment

Figure 4A:
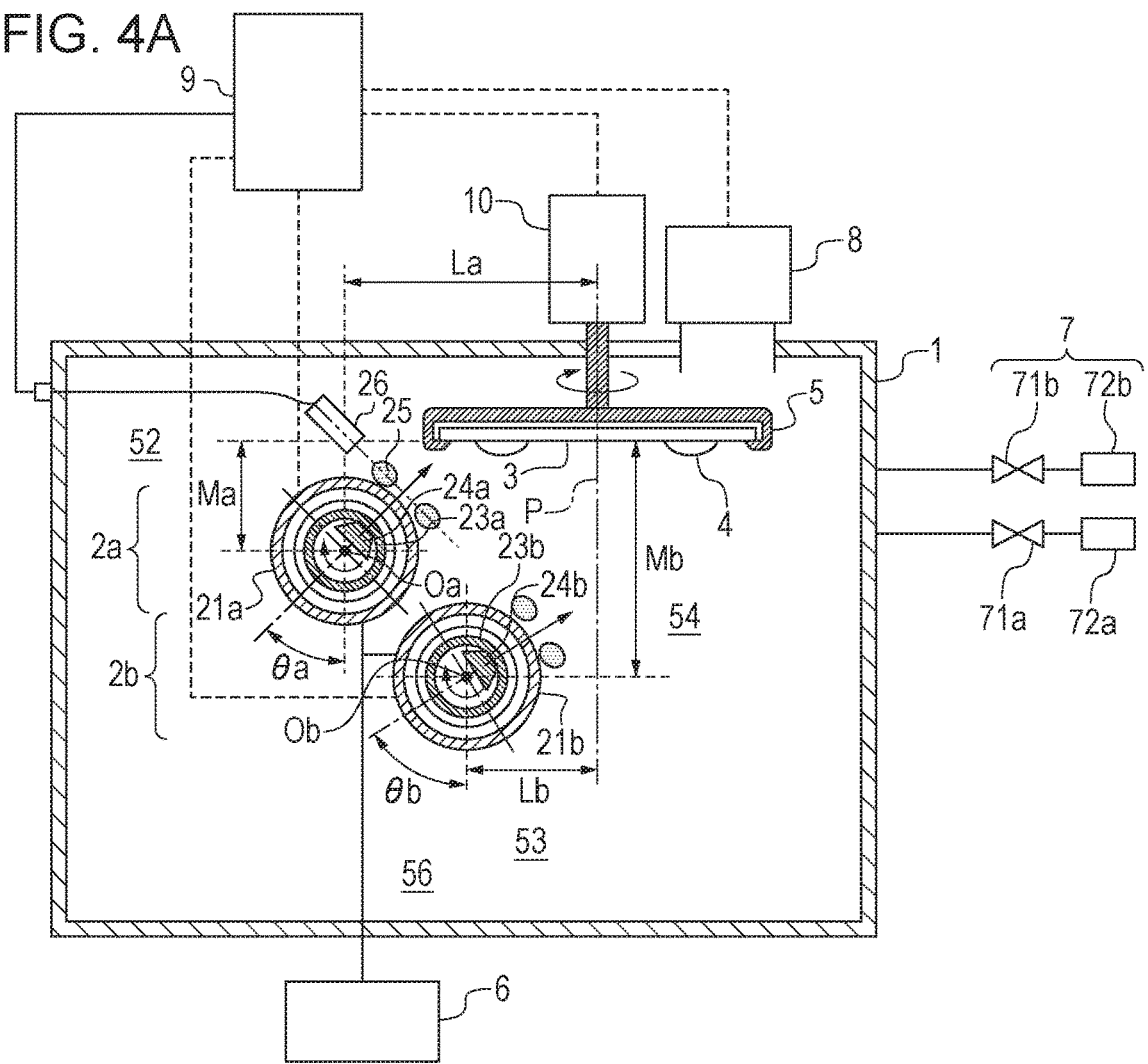
FIG. 4A is a sectional view, taken in a vertical direction, of the schematic configuration of a film forming apparatus according to a second embodiment.

FIG. 4A is a sectional view, taken in a vertical direction, of the schematic configuration of a film forming apparatus according to a second embodiment. The film forming apparatus according to the first embodiment includes only one cathode portion 2; whereas the film forming apparatus according to the present embodiment includes a plurality of cathode portions. Specifically, the film forming apparatus includes a first cathode portion 2a and a second cathode portion 2b. The first cathode portion 2a rotates around an axis Oa (second rotation axis) at a position skewed with respect to the rotation axis P (first rotation axis) of the chucking 5. The second cathode portion 2b rotates around an axis Ob (third rotation axis) parallel to the axis Oa. Furthermore, in the first embodiment, the power supply 6 that supplies electric power to the cathode portion 2 is a direct-current power supply; whereas, in the present embodiment, an alternating-current power supply is used, and the alternating-current power supply supplies electric power alternately to the cathode portions 2a, 2b. Except these differences, the configurations of the chamber 1, cathode portions 2a, 2b, gas supply unit 7, exhaust device 8, controller 9, chucking 5, rotating mechanism 10 of the chucking 5, and other components are similar to those of the first embodiment, so the description thereof is omitted. The configuration of the PEM 26 is similar to that of the first embodiment, and one PEM 26 that detects emission of plasma that is generated at one of at least two targets is provided. Alternatively, the PEM 26 may be provided for each target, and may individually detect emission of plasma that is generated at each of the targets, or the single PEM 26 may detect a total value of plasma that is generated at two targets. Since motors that respectively drive targets 21a, 21b and magnets 24a, 24b are individually provided, the targets 21a, 21b and the magnets 24a, 24b are rotatable independent of one another. Therefore, the inclination angle θa of the magnet 24a and the inclination angle θb of the magnet 24b can be adjusted respectively for the cathode portions 2a, 2b, and the emission directions of sputtered particles that are emitted from the targets 21a, 21b can be individually controlled. Therefore, when simulations are performed on the relationship between the inclination angle of the magnet 24 and the film thickness distribution of a film that adheres to the base material 4, the emission angle distribution of sputtered particles and the inclination angle of the magnet 24 are set for each target, and a total value of the film thickness distributions is calculated.

The materials of the targets that are respectively mounted on the plurality of cathode portions are not specifically limited. When a uniform film is intended to be formed on a base material, targets made of the same material are mounted on the cathode portions.

The cathode portions 2a, 2b and the chucking 5 are disposed at positions that satisfy the relationship Ma<Mb where Ma is the distance in the vertical direction between the cathode portion 2a and the base material support surface of the base material holder 3 and Mb is the distance in the vertical direction between the cathode portion 2b and the base material support surface. In addition, the cathode portions 2a, 2b and the chucking 5 are disposed such that the relationship La>Lb is satisfied where La is the distance in a horizontal direction between the rotation axis Oa of the cathode portion 2a and the rotation axis P of the chucking 5 and Lb is the distance in the horizontal direction between the rotation axis Ob of the cathode portion 2b and the rotation axis P.

Figure 4B:
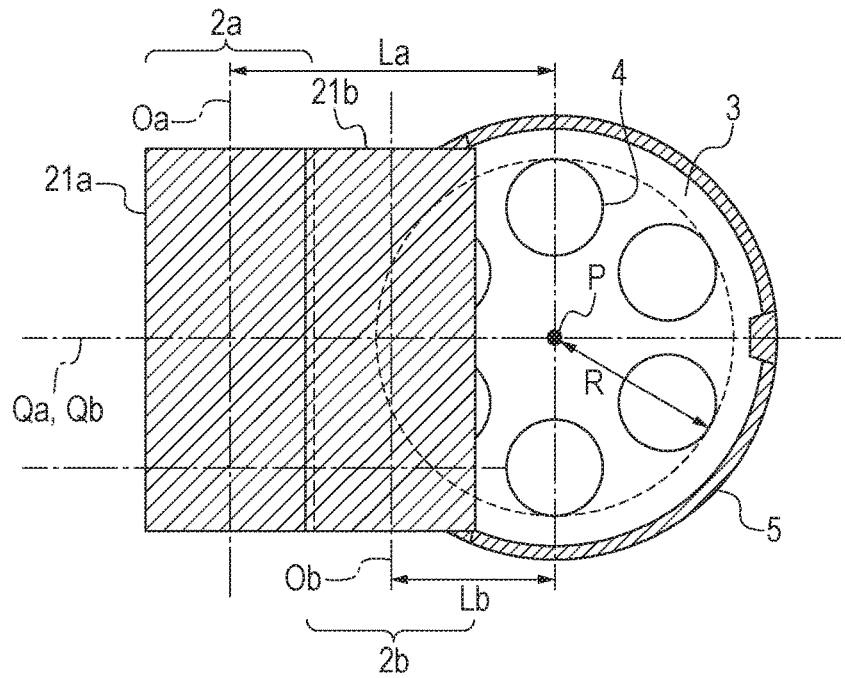
FIG. 4B is a view illustrating cathode portions and the base material holding side of the chucking when viewed in the direction along the rotation axis P.

FIG. 4B is a view illustrating the positional relationship between the mounted regions of the targets 21a, 21b and the chucking 5 when the cathode portions 2a, 2b and the base material support surface of the chucking 5 are viewed in the direction along the rotation axis P. In FIG. 4B, any of a center line Qa of the mounted region of the target 21a in a direction along the rotation axis Oa of the cathode portion 2a and a center line Qb of the mounted region of the target 21b in a direction along the rotation axis Ob of the cathode portion 2b is disposed at a position passing through the center of the chucking 5. The width of each of the cathode portions 2a, 2b in the direction of the rotation axis Oa (Ob) of the mounted region of the target 21a or target 21b is greater than the diameter 2R of the circle drawn by the points farthest from the rotation axis P within the film-formed surface of the base material 4.

The above configuration is particularly suitable for the case where film formation is performed with the base material holder 3 illustrated in FIG. 2. In FIG. 2, film formation on the film-formed surface outside a circle S drawn by the center of the base material 4 as a result of the rotation of the chucking 5 is mainly assigned to the target 21a, and film formation on the film-formed surface inside the circle S is mainly assigned to the target 21b. When the inclination angle of the magnet 24a is adjusted so as to be less than the inclination angle of the magnet 24b, a further uniform film is achieved.

It is desirable that the amount of shift La as well as the amount of shift L of the first embodiment be greater than or equal to the radius R of the circle drawn by the points farthest from the rotation axis P within the film-formed surface of the base material 4. It is desirable that the amount of shift Lb be greater than or equal to ½ R and less than or equal to La. It is more desirable that the amount of shift Lb be greater than or equal to ½ R and less than or equal to R.

In the present embodiment, the number of cathode portions is two. Alternatively, the number of cathode portions may be three or more. In addition, the cathode portions 2a, 2b are disposed on the same side of the rotation axis P of the chucking 5. Alternatively, as long as the relationship Ma<Mb and the relationship La>Lb are satisfied, the cathode portions 2a, 2b may be disposed at symmetric positions with respect to the rotation axis P. However, from the viewpoint of reduction of the floor space of the apparatus, the configuration that the cathode portions 2a, 2b are disposed on the same side of the rotation axis P as illustrated in FIG. 4 is desirable.

Third Embodiment

The cross section, in the vertical direction, of the schematic configuration of a film forming apparatus according to the present embodiment is similar to that of FIG. 4A as in the case of the second embodiment; however, the disposition when the cathode portions 2a, 2b and the base material holding side of the chucking 5 are viewed in the direction along the rotation axis P differs from that of the second embodiment.

Figure 5:
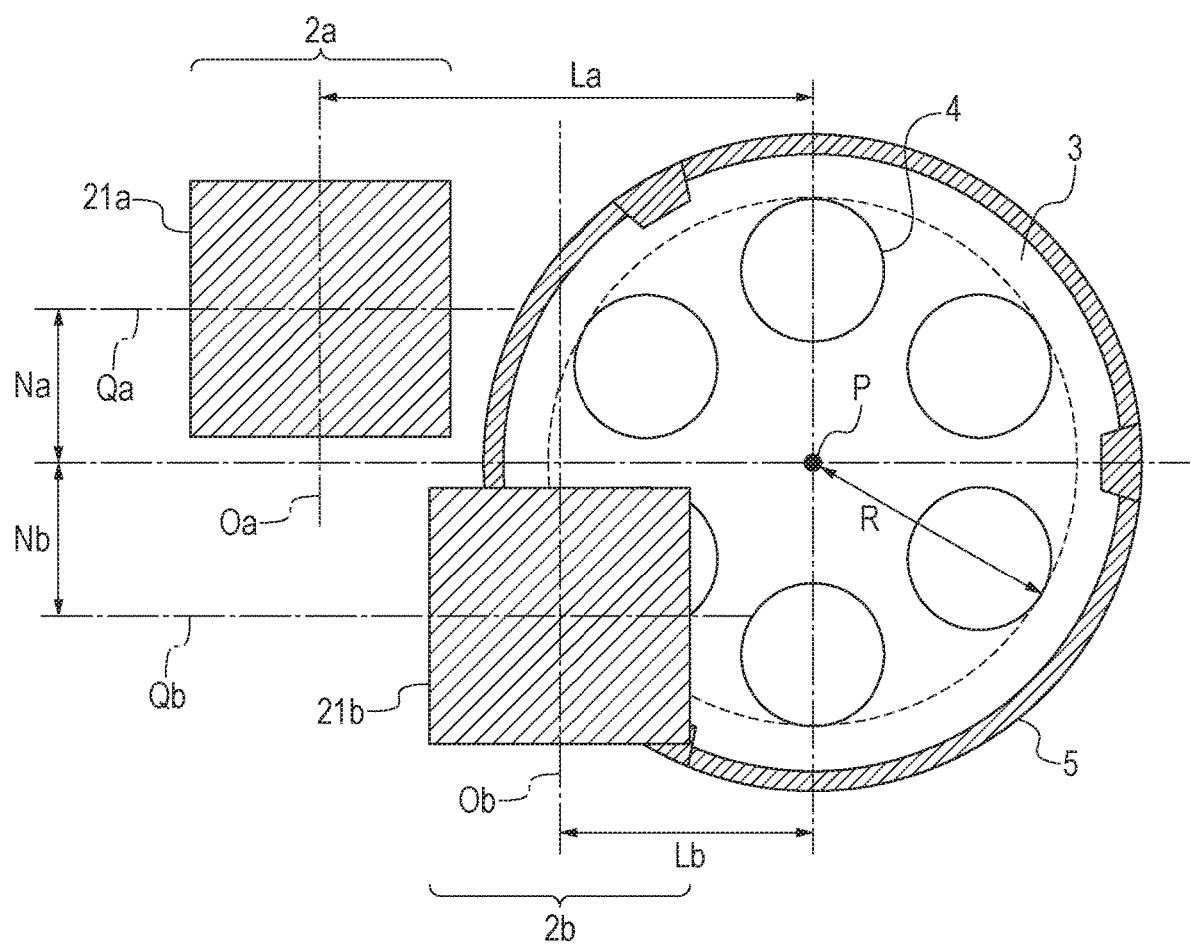
FIG. 5 is a view illustrating the cathode portions and the base material holding side of the chucking when a film forming apparatus according to a third embodiment is viewed in the direction along the rotation axis P.

FIG. 5 illustrates the positional relationship between the mounted regions of the targets 21a, 21b and the chucking 5 in the film forming apparatus according to the present embodiment when the cathode portions 2a, 2b and the base material holding side of the chucking 5 are viewed in the direction along the rotation axis P.

In the present embodiment, the width of each of the cathode portions 2a, 2b in the direction of the rotation axis Oa (Ob) of the mounted region of the target 21a or target 21b is less than the diameter 2R of the circle drawn by the points farthest from the rotation axis P within the film-formed surface of the base material 4. The center line Qa of the mounted region of the target 21a in the direction along the rotation axis Oa of the cathode portion 2a is disposed at a position shifted by Na from the center of the chucking 5 in the direction of the rotation axis Oa. The center line Qb of the mounted region of the target 21b in the direction along the rotation axis Ob of the cathode portion 2b is disposed at a position shifted by Nb from the center of the chucking 5 in the direction of the rotation axis Ob. The amounts of shift Na, Nb may be equal to each other or may be different amounts.

Fourth Embodiment

The present embodiment differs from the first embodiment in that the position of the magnet in the radial direction of the rotation operation of the cathode portion 2 is adjustable with a magnet elevating mechanism.

Figure 6:
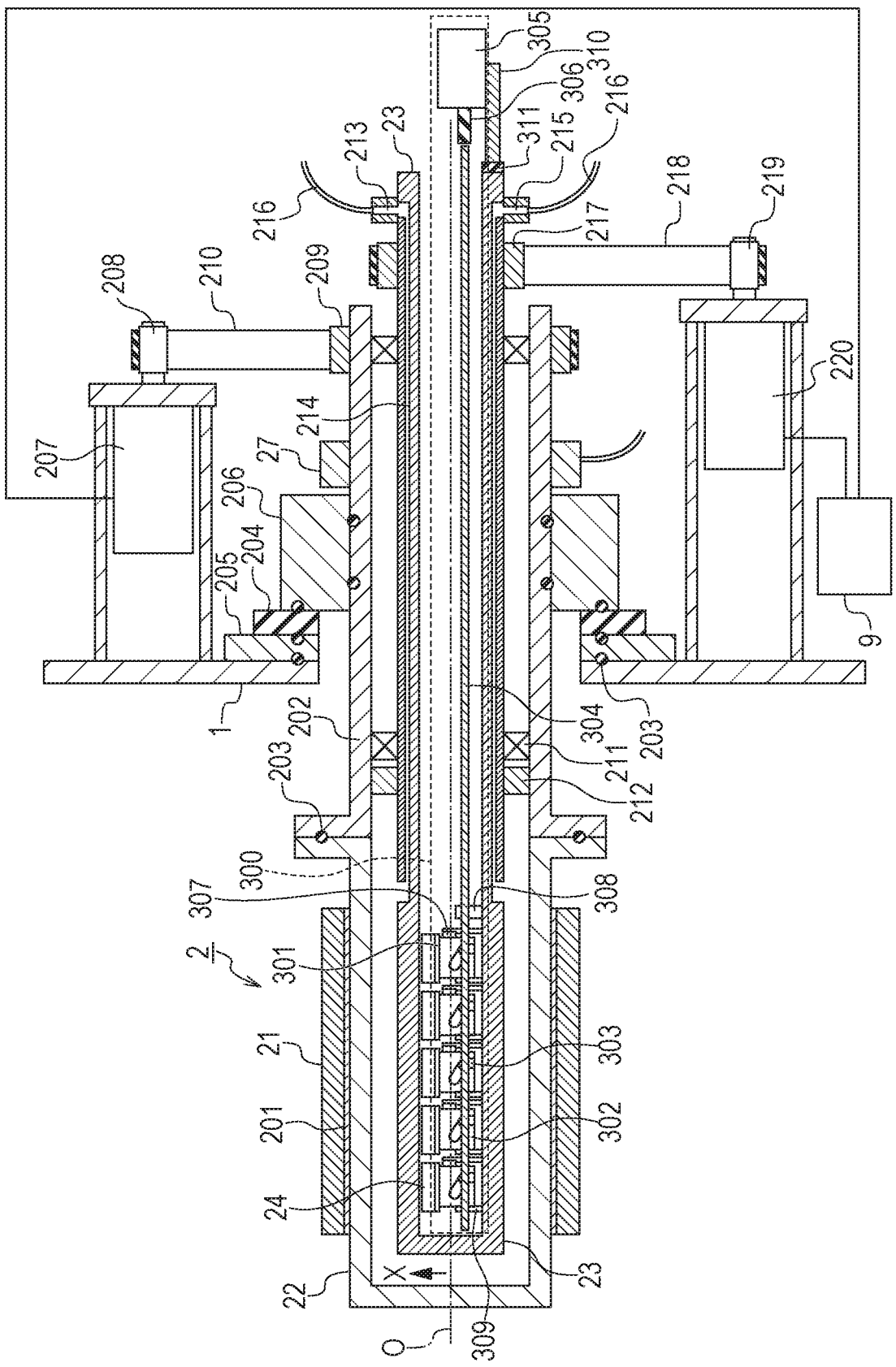
FIG. 6 is a schematic sectional view, taken along the rotation axis of the whole cathode portion according to a fourth embodiment.
Figure 7A:
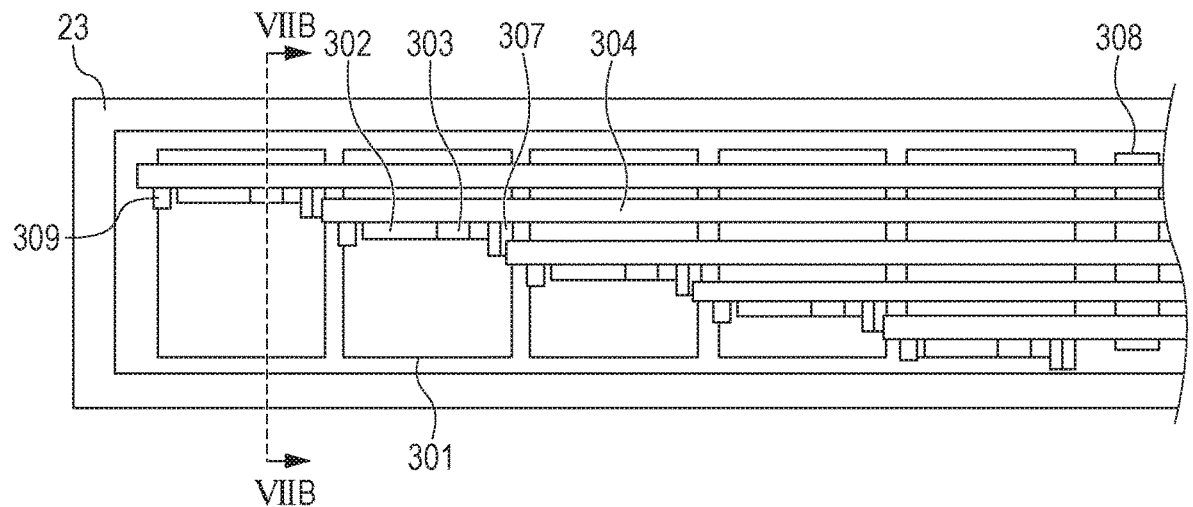
FIG. 7A is a plan view of a portion of a magnet elevating mechanism of FIG. 6 when viewed in a radial direction of a rotation operation of the cathode portion.
Figure 7B:
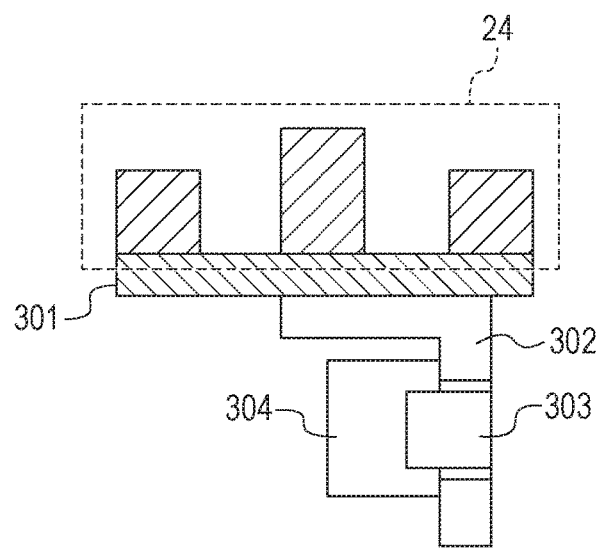
FIG. 7B is a sectional view taken along the line VIIB-VIIB in FIG. 7A.

FIG. 6 illustrates the schematic sectional view, taken along the rotation axis, of the whole cathode portion 2 according to the present embodiment. FIG. 7A is a plan view of a portion, where the magnet 24 is placed, of the magnet elevating mechanism 300 of FIG. 6 when viewed in the radial direction X of the rotation operation of the cathode portion 2. FIG. 7B is a sectional view taken along the line VIIB-VIIB in FIG. 7A.

The magnet elevating mechanism 300 includes a yoke 301 on which the magnet 24 is mounted, a cam groove bracket 302 connected to the yoke 301, and a cam follower 303 configured to move inside a groove of the cam groove bracket 302. The magnet elevating mechanism 300 further includes a transmission shaft 304 that transmits actuating force from a direct-acting actuator 305 to the cam follower 303 via an electrically insulating shaft member 306.

The magnet 24 contains a pair of magnets having mutually different polarities such that a magnetic field that captures electrons is formed on the surface of the target 21. The magnet 24 is provided so as to be divided into multiple pieces (five in FIG. 6) along the rotation axis O of the cathode portion 2. The divided magnets 24 are fixed to the yoke 301 by adhesive.

The yoke 301 is mounted on the cam groove bracket 302. The cam groove bracket 302 is fixed to an actuating shaft guide 307 mounted on the magnet case shaft 23. With the actuating shaft guide 307, movement of the cam groove bracket 302 is restricted to only in the radial direction X of the rotation operation of the cathode portion 2. Also, displacement, in a direction other than an actuated direction, of each magnet 24 due to repulsive force or attractive force that is generated between the divided magnets 24 is prevented. In the present embodiment, a slide bearing is used as the actuating shaft guide 307. Alternatively, a ball bearing, for example providing a linear guide, may be used.

The cam follower 303 is disposed in the groove of the cam groove bracket 302. When actuating force along the rotation axis O of the cathode portion 2 is transmitted to the cam follower 303 by the transmission shaft 304, the cam follower 303 moves along the groove of the cam groove bracket 302, and causes the corresponding one of the magnets 24 to move in the radial direction X of the rotation operation of the cathode portion 2.

The transmission shaft 304 is supported by a shaft slide bearing 308 so as to move along the rotation axis O of the cathode portion 2. This prevents a drop-off of the cam follower 303 from the groove of the cam groove bracket 302. The distal end of the transmission shaft 304 is supported by a deflection prevention guide 309. This reduces a deformation of the transmission shaft 304 in a bending direction due to repulsive force or attractive force that is generated between the magnets 24. When the cross section of the transmission shaft 304 has a rectangular shape and the side of the transmission shaft 304 is restricted by the shaft slide bearing 308 or the deflection prevention guide 309, a twist of the transmission shaft 304 is prevented.

The direct-acting actuator 305 actuates the transmission shaft 304 via the electrically insulating shaft member 306. A bracket 310 on which the direct-acting actuator 305 is mounted is fixed to the magnet case shaft 23 via an electrically insulating bracket member 311. With these electrically insulating members, flow of current for sputtering to the direct-acting actuator 305 is prevented.

The cam groove bracket 302, the transmission shaft 304, the cam follower 303, the deflection prevention guide 309, and the direct-acting actuator 305 are provided for each magnet 24, and the magnets 24 can be actuated independently of one another. The materials of components disposed near the magnets 24 all are made of a non-magnetic material so as not to interfere with a magnetic field that is formed by the magnets 24.

When the position of the magnet 24 in the radial direction of the rotation operation of the cathode portion 2 is changed, the distance between the magnet 24 and the target 21 varies, and the intensity of plasma that is attracted to the target 21 varies. Accordingly, the amount of emission of sputtered particles that are emitted from the target 21 varies. When the positions, in the radial direction of the rotation operation of the cathode portion 2, of the magnets 24 provided separately along the rotation axis of the cathode portion 2 are individually adjusted, the amount of emission of sputtered particles in the direction along the rotation axis of the cathode portion 2 can be adjusted.

When the positions of the magnets 24 in the radial direction of the rotation operation of the cathode portion 2 are added as parameters at the time of simulations that are performed before film formation, described in the first embodiment, film thickness nonuniformity of a film that is formed on the base material 4 is reduced. Information about the position of each magnet 24 in the radial direction of the rotation operation of the cathode portion 2, calculated in simulations, is transmitted from the controller 9 to the direct-acting actuator 305, and the direct-acting actuator 305 controls the position of the magnet 24 in accordance with an instruction.

In the present embodiment, in addition to the inclination angle of the magnet 24 in the rotation direction of the cathode portion 2 being adjusted, the positions, in the radial direction of the rotation operation of the cathode portion 2, of the magnets 24 provided separately along the rotation axis of the cathode portion 2 are individually adjusted. With this configuration, film formation can be performed on the base material 4 with a further uniform film thickness.

Fifth Embodiment

A magnet elevating mechanism in the present embodiment differs from that of the fourth embodiment in that the magnet elevating mechanism has a structure that reduces influence caused by repulsive force or attractive force that is generated between the magnets 24.

Figure 8A:
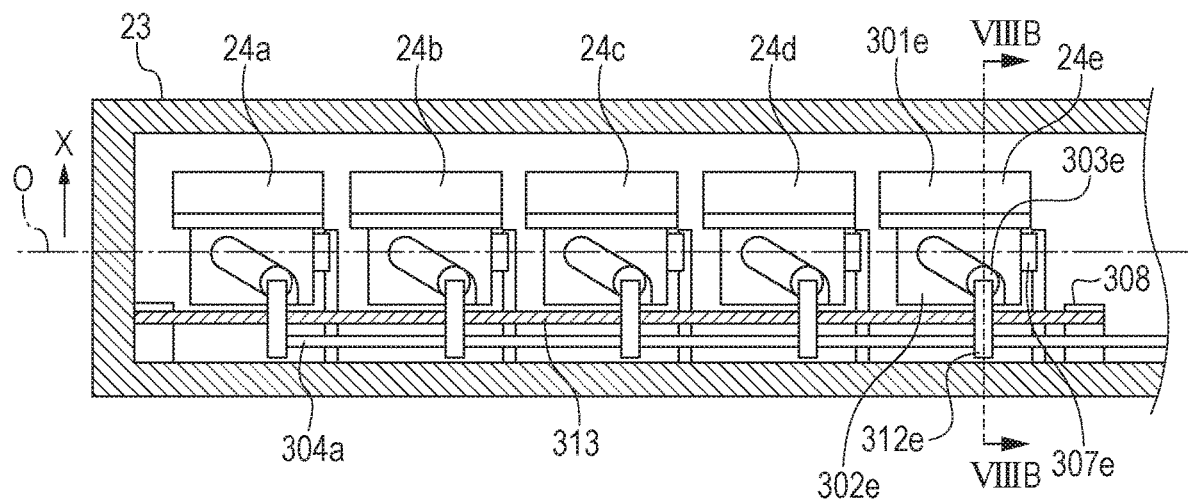
FIG. 8A is a schematic sectional view, taken along the rotation axis, of the cathode portion according to a fifth embodiment.
Figure 8B:
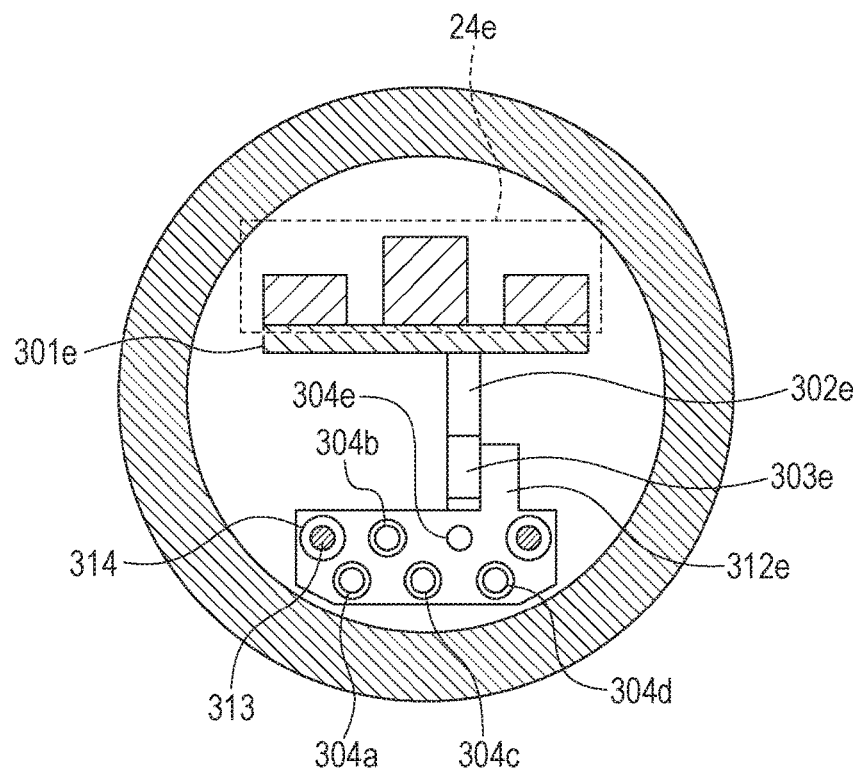
FIG. 8B is a sectional view taken along the line VIIIB-VIIIB in FIG. 8A.

FIG. 8A is a schematic sectional view, taken along the rotation axis, of the cathode portion 2 according to the present embodiment, and illustrates a portion where the magnets 24 are mounted in a magnified view. In FIG. 8A and FIG. 8B, in order from the distal end side of the cathode portion 2, the magnets 24 are referred to as the magnets 24a, 24b, 24c, 24d, 24e, and suffixes a to e are assigned to members associated with actuation of the corresponding magnets 24. FIG. 8B is a sectional view taken along the line VIIIB-VIIIB in FIG. 8A, that is, a view of a portion that actuates the magnet 24e when viewed from the distal end side of the cathode portion 2. Since the mechanism of elevating or lowering each magnet 24 is identical, the suffixes a to e are omitted unless the structure of a specified magnet or specified magnets is described. Hereinafter, the structure different from that of the fourth embodiment will be mainly described with reference to the drawings, and the description of the common structure is omitted.

The magnet elevating mechanism 300 includes the magnets 24, the cam groove brackets 302, the transmission shafts 304, the cam followers 303, and cam follower brackets 312. Each of the magnets 24 divided into multiple pieces (five in FIG. 8A) is fixed to the yoke 301, and is mounted on the cam groove bracket 302.

The cam follower 303 is mounted on the cam follower bracket 312. The cam follower 303 moves the magnet 24 in the radial direction X of the rotation operation of the cathode portion 2 along the groove of the cam groove bracket 302 as a result of movement of the cam follower bracket 312.

Two guide shafts 313 parallel to the rotation axis O of the cathode portion 2 are passed in common through each cam follower bracket 312 that actuates a corresponding one of the magnets 24 and restrict movement of the cam follower bracket 312 in a direction other than the direction along the rotation axis O of the cathode portion 2. As illustrated in FIG. 8B, a guide shaft bearing 314, such as a slide bearing or a linear bushing, is provided between each guide shaft 313 and the cam follower bracket 312. Thus, frictional force between the cam follower bracket 312 and each guide shaft 313 is reduced. The guide shafts 313 support the cam follower bracket 312 to prevent a displacement or change in position of the cam follower bracket 312 due to repulsive force or attractive force that is generated between the magnets 24. In the present embodiment, repulsive forces that act on the magnets 24 in the direction of the axis of turn of the magnets act in opposite directions between any adjacent magnets 24, so a deformation of the guide shafts 313 is reduced.

Furthermore, in the present embodiment, the two guide shafts 313 disposed at spaced apart positions support the cam follower bracket 312, and restrict the position of the cam follower 303. Therefore, as compared to the fourth embodiment, a positioning error of the magnet 24 resulting from a change in the position of the cam follower 303 is small.

In FIG. 8B, the transmission shaft 304e for elevating or lowering the magnet 24e is connected to the cam follower bracket 312e, and transmits actuating force generated by the direct-acting actuator 305 to the cam follower bracket 312e. The cam follower bracket 312e has through-holes greater in diameter than the transmission shafts 304a to 304d so as not to interfere with the transmission shafts 304a to 304d for elevating or lowering the other magnets 24a to 24d. The transmission shafts 304a to 304d pass through the through-holes and are connected to the predetermined cam follower brackets 312a to 312d.

As described above, according to the present embodiment, influence due to repulsive force or attractive force that is generated between the magnets 24 and, in addition, influence due to a deformation of the guide shafts 313 are reduced, so positioning of the magnets 24 is performed with high accuracy. As a result, variations in the film thickness of a film that is formed on the base material are further reduced.

Example 1

Film formation is performed with the film forming apparatus including the single cathode portion 2, illustrated in FIG. 1A. The material of the target 21 is Si, and the dimensions of the target 21 are such that the outside diameter is 152 mm, the inside diameter is 140 mm, and the length in the direction along the rotation axis O is 100 mm.

The base material holder 3 having a diameter of 250 mm and that can hold a single lens (base material) 4 having a diameter of 230 mm is used, and is mounted such that the rotation axis P of the chucking 5 coincides with the central axis of the lens 4.

In FIG. 1A and FIG. 1B, parameters of the disposition of the base material holder 3 and the single cathode portion 2 are as follows. M is the shortest distance from the rotation axis O of the cathode portion 2 to a virtual plane containing the base material holder 3.

M=155 mm
L=245 mm

Initially, a single measurement base material (lens) having a diameter of 230 mm with the same convex shape as Sample 1 shown in Table 1 was prepared, film formation was actually performed, the film thickness distribution was measured, and the emission angle distribution of sputtered particles that were emitted from the target was obtained.

Simulations are performed on each of the lens shapes shown in Table 1 based on the emission angle distribution of sputtered particles, obtained through measurement, the inclination angle $\theta$ of the magnet 24 suitable for uniform film formation is calculated (see Table 1), and the position of the magnet 24 is adjusted such that the calculated inclination angle is attained. The inclination angle is locked during film formation.

For each lens shown in Table 1, the lens is set in the base material holder 3 and is subjected to film formation one by one. Specifically, Ar is supplied as sputtering gas from the process gas supply line 71a of the gas supply unit 7, the base material holder 3 and the target 21 are rotated, and sputtering is performed in metal mode by supplying electric power to the Si target 21.

In this Example, by supplying oxidizing gas to the Si film formed on the base material 4 to cause a reaction, a SiO film is formed on the base material 4. Specifically, the supply port of the reactive gas supply line 72b is disposed near the base material holder 3, and a small amount of gas containing oxygen radicals is supplied to the surface of the base material 4. At this time, by supplying gas containing oxygen radicals such that the oxygen radicals do not reach the target 21, metal-mode sputtering is maintained.

The film thickness of the obtained film is measured, and the film thickness distribution is evaluated with the use of the following mathematical expression.

Film thickness distribution=±(Maximum film thickness−Minimum film thickness)/(Maximum film thickness+Minimum film thickness)

The film thickness is measured at the center of the base material 4 and the points radially shifted by 50 mm or 100 mm from the center in a cross shape, that is, nine points in total. The results are collectively shown in Table 1.

TABLE 1

| | Lens Shape | | Inclination | |
| --- | --- | --- | --- | --- |
| Sample Name | Diameter | Surface Shape | Half-Aperture Angle | Angle of Magnet $\theta$ | Film Thickness Distribution |
| Sample 1 | 230 mm | Convex Surface | 40° | 35° | ±3% |
| Sample 2 | 230 mm | Concave Surface | 40° | 75° | ±4% |

It is verified from Table 1 that, irrespective of whether the lens has a convex surface or a concave surface, a uniform film whose film thickness distribution falls within the range of ±4% is formed on the surface having a half-aperture angle of 40° or greater.

Example 2

Film formation is performed with the film forming apparatus including the two cathode portions 2a, 2b, illustrated in FIG. 4.

The material of the targets 21a, 21b is Si, and the dimensions of each of the targets 21a, 21b are such that the outside diameter is 101 mm, the inside diameter is 89 mm, and the length in the direction along the rotation axis O is 100 mm.

The base material holder 3 having a diameter of 250 mm and that can hold eight lenses (base materials) 4 at equal intervals in the circumferential direction is used. The diameter of the circle drawn by the points farthest from the first rotation axis within the film-formed surfaces of the base materials 4 supported by the chucking 5 is 180 mm. In FIG. 4A and FIG. 4B, parameters of the disposition of the base material holder 3 and the two cathode portions 2a, 2b are as follows.

Ma=70 mm, Mb=232 mm
La=252 mm, Lb=173 mm

Eight of each of the lenses (base materials) 4 having a diameter of 50 mm with shapes of three types shown in Table 2 are prepared. As preparation in advance, film formation was performed on a measurement base material having the same shape as Sample 3, and the emission angle distribution of sputtered particles that were emitted from the targets 21a, 21b was obtained as in the case of Example 1.

Based on the obtained emission angle distribution of sputtered particles, simulations are performed for each of the lens shapes shown in Table 2 when eight of each are held by the base material holder 3, and the inclination angles θa, θb of the magnets 24a, 24b at which a uniform film thickness is obtained are calculated (see Table 2). The positions of the magnets 24a, 24b are adjusted such that the calculated inclination angles are attained, and then the positions are locked.

For each set of lens(es) having the same shape shown in Table 2, the lenses are set in the base material holder 3 and are subjected to film formation. First, the lenses 4 are set, the base material holder 3 and the targets 21a, 21b are rotated, and air inside the chamber 1 is exhausted. Ar is supplied as sputtering gas from the process gas supply line 71a of the gas supply unit 7, and sputtering is performed in metal mode by alternately supplying electric power to the Si targets 21a, 21b through AC discharge. An AC power supply that has a frequency of 40 kHz and that is able to supply electric power up to 10 kW is used as the power supply to supply electric power to the targets 21a, 21b. Other than the above, the same conditions as those of Example 1 are applied, film formation is performed, and the obtained film thickness distributions of the films are evaluated. The results are collectively shown in Table 2.

TABLE 2

| | | Lens Shape | | Inclination | | |
|---|---|---|---|---|---|---|
| | | | Half- | Angle of Magnet | | Film Thickness |
| Sample | Diameter | Surface Shape | Aperture Angle | θa | θb | Distribution |
| Sample 3 | 50 mm | Convex Surface | 40° | 40° | 14° | ±2% |
| Sample 4 | 50 mm | Convex Surface | 50° | 40° | 6° | ±3% |
| Sample 5 | 50 mm | Concave Surface | 40° | 55° | 15° | ±3% |

It is verified from Table 2 that, irrespective of whether the lens has a convex surface or a concave surface, a uniform film whose film thickness distribution falls within the range of ±3% is formed on the surface having a half-aperture angle of 40° or greater. It is also verified that a further uniform film is formed as compared to Example 1 where the single target is used.

Example 3

In this Example, a similar apparatus to that of Example 2 is used except the point that, in FIG. 4A and FIG. 4B, the parameters of the disposition of the base material holder 3 and the two cathode portions 2a, 2b are changed to the following values.

Ma=75 mm, Mb=175 mm
La=180 mm, Lb=90 mm

Eight lenses 4 having a diameter of 50 mm and a convex surface with a half-aperture angle of 40° are prepared. As preparation in advance, film formation was performed on a measurement base material having the same shape, and the emission angle distribution of sputtered particles that were emitted from the target was obtained as in the case of Example 1.

Based on the obtained emission angle distribution of sputtered particles, simulations are performed when eight of each of the lenses 4 are held by the base material holder 3, and the inclination angles θa, θb of the magnets 24a, 24b at which a uniform film thickness is obtained are calculated (see Table 3). The positions of the magnets 24a, 24b are adjusted such that the calculated inclination angles are attained, and then the positions are locked.

The lenses shown in Table 3 are set in the base material holder 3, the base material holder 3 and the targets 21a, 21b are rotated, and air inside the chamber 1 is exhausted. Ar as sputtering gas and $O_2$ as reactive gas are supplied from the gas supply unit 7, the targets 21a, 21b are subjected to sputtering in transition mode, and a $SiO_2$ film is formed on the lenses 4. $SiO_2$ film formation in transition mode (film formation of a transparent film) and its film formation rate are controlled through PEM control. In this method, the gas flow rate of Ar is adjusted with the valve 71b, and the gas flow rate of $O_2$ is adjusted with the valve 72b. The results of evaluation of the obtained film thickness distribution as in the case of Example 1 are shown in Table 3.

TABLE 3

| | | Lens Shape | | Inclination | | |
|---|---|---|---|---|---|---|
| | | | Half- | Angle of Magnet | | Film Thickness |
| Sample | Diameter | Surface Shape | Aperture Angle | θa | θb | Distribution |
| Sample 6 | 50 mm | Convex Surface | 40° | 50° | 25° | ±4% |

It is verified from Table 3 that a uniform film whose film thickness distribution falls within the range of ±4% is formed on the convex surface with a half-aperture angle of 40° or greater.

Example 4

In this Example, a similar apparatus to that of Example 2 is used except the point that the width of each of the targets 21a, 21b along the rotation axis O is 300 mm that is greater than that of Example 1 and, in FIG. 4A and FIG. 4B, the parameters of the disposition of the base material holder 3 and the two cathode portions 2a, 2b are changed to the following values.

Ma=70 mm, Mb=229 mm
La=252 mm, Lb=173 mm

Simulations are performed when eight of each of the lenses (base materials) 4 having shapes of two types shown in Table 4 are prepared and the lenses are subjected to film formation, and the inclination angles θa, θb of the magnets 24a, 24b are calculated (see Table 4). The emission angle distribution of sputtered particles that are emitted from the target to be used in simulations was obtained by actually performing film formation on a measurement base material (lens) having the same shape as Sample 7 of Table 4.

The magnets 24a, 24b are adjusted to the calculated inclination angles and locked, and film formation similar to that of Example 2 is performed. The results are shown in Table 4.

TABLE 4

| | Lens Shape | | Inclination | | |
|---|---|---|---|---|---|
| | | Half-Aperture | Angle of Magnet | | Film Thickness |
| Sample | Diameter | Shape | Angle | θa | θb | Distribution |
| Sample 7 | 50 mm | Convex Surface | 40° | 40° | 6° | ±2% |
| Sample 8 | 50 mm | Concave Surface | 40° | 60° | 15° | ±2% |

It is verified from Table 4 that, irrespective of whether the lens has a convex surface or a concave surface, a uniform film whose film thickness distribution falls within the range of ±2% is formed on the surface having a half-aperture angle of 40° or greater.

Example 5

Film formation is performed with the film forming apparatus including the two cathode portions 2a, 2b, illustrated in FIG. 5.

The material of the targets 21a, 21b is Si, and the dimensions of each of the targets 21a, 21b are such that the outside diameter is 101 mm and the inside diameter is 89 mm as in the case of Example 2.

Parameters of the disposition of the base material holder 3 and the two cathode portions 2a, 2b in FIG. 5 are as follows.
Ma=70 mm, Mb=173 mm
La=252 mm, Lb=90 mm
Na=232 mm, Nb=70 mm In this Example, the length, in the direction along the rotation axis Oa, of the target mounted region of the cathode portion 2a and the length, in the direction along the rotation axis Ob, of the target mounted region of the cathode portion 2b are less than twice the distance R between the rotation axis P and the points farthest from the rotation axis P within the range through which the film-formed surfaces of the base materials 4 supported by the chucking 5 can pass. The center line Qa of the mounted region of the target 21a in the direction along the rotation axis Oa of the cathode portion 2a is disposed at a position shifted by Na from the center of the chucking 5 in the direction of the rotation axis Oa. The center line Qb of the mounted region of the target 21b in the direction along the rotation axis Ob of the cathode portion 2b is disposed at a position shifted by Nb from the center of the chucking 5 in the direction of the rotation axis Ob.

Figure 9:
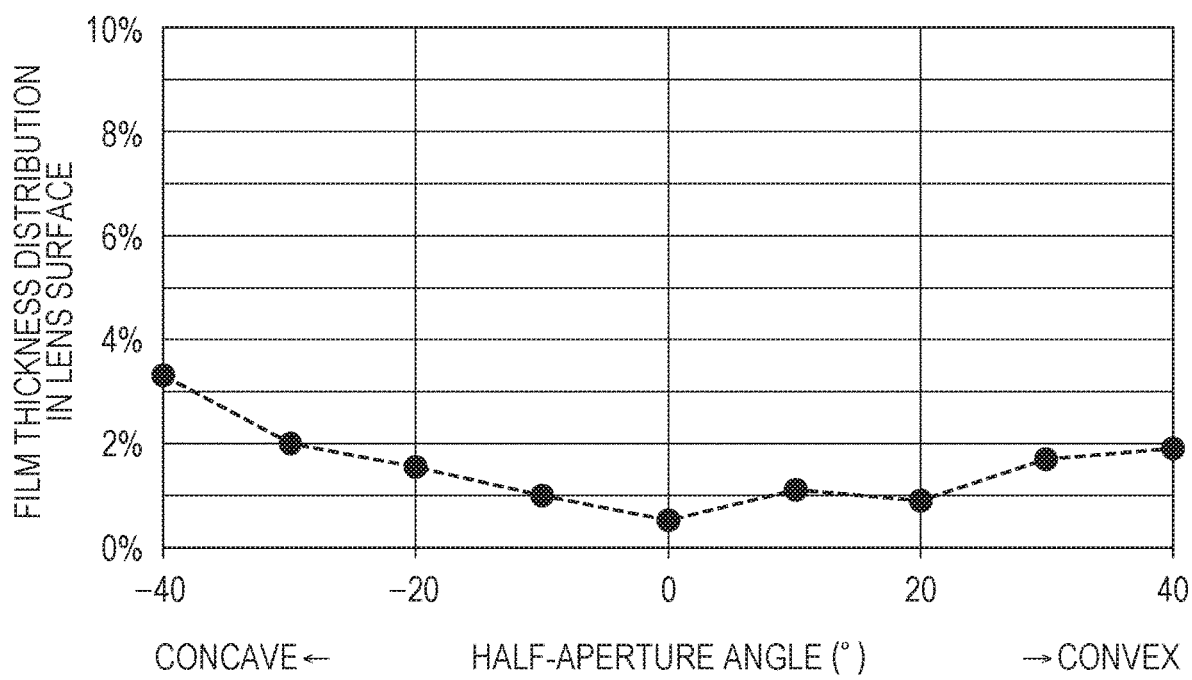
FIG. 9 is a graph illustrating the distribution of film thickness within a surface of a lens, manufactured in Example 5, for a half-aperture angle.

Eight of each of the lenses (base materials) 4 having a diameter of 50 mm with shapes of two types shown in Table 5 are prepared, the lenses are subjected to simulations, and the inclination angles θa, θb of the magnets 24a, 24b are calculated (see Table 5). The emission angle distribution of sputtered particles that were emitted from the target to be used in simulations was obtained by actually performing film formation on a measurement base material (lens) having the same shape as Sample 13 of Table 5. The magnets 24a, 24b are adjusted to the calculated inclination angles, and the inclination angles are maintained during film formation. Film formation is performed as in the case of Example 2. The results are shown in Table 5, and the film thickness distribution in the surface of the lens 4 for a half-aperture angle is illustrated in FIG. 9.

TABLE 5

| | Lens Shape | | Inclination | | |
|---|---|---|---|---|---|
| | | Half-Aperture | Angle of Magnet | | Film Thickness |
| Sample | Diameter | Shape | Angle | θa | θb | Distribution |
| Sample 9 | 50 mm | Concave Surface | 40° | 55° | 45° | ±3.3% |
| Sample 10 | 50 mm | Concave Surface | 30° | 60° | 45° | ±2.0% |
| Sample 11 | 50 mm | Concave Surface | 20° | 55° | 60° | ±1.7% |
| Sample 12 | 50 mm | Concave Surface | 10° | 55° | 60° | ±1.0% |
| Sample 13 | 50 mm | Flat Surface | 0° | 55° | 50° | ±0.6% |
| Sample 14 | 50 mm | Convex Surface | 10° | 55° | 60° | ±2.1% |
| Sample 15 | 50 mm | Convex Surface | 20° | 55° | 45° | ±2.0% |
| Sample 16 | 50 mm | Convex Surface | 30° | 55° | 40° | ±2.8% |
| Sample 17 | 50 mm | Convex Surface | 40° | 45° | 15° | ±2.0% |

For lenses having a concave surface or convex surface with a large half-aperture angle of 40°, the film thickness distributions are about ±3%. It is verified that a uniform film thickness is achieved. For lenses having a concave surface or convex surface with a half-aperture angle of 30° or less, the film thickness distributions are less than or equal to ±2%. It is verified that a further uniform film thickness is achieved.

Comparative Example

As Comparative Example, film formation is performed with an apparatus in which the center of the chucking 5 coincides with the center of a target mounted region when viewed in the direction along the rotation axis of the chucking 5. Specifically, the parameters of the disposition of the base material holder 3 and single cathode portion 2 in FIG. 1A are set such that M=175 mm and L=0 mm, and the dimensions of the target to be mounted on the cathode portion 2 are the same as those of Example 1. Simulations are performed when eight lenses 4 having the same convex shape with a half-aperture angle of 40° as Sample 3 are disposed as in the case of Example 3, and then 0° is obtained as the inclination angle θ of the magnet 24. The emission angle distribution of sputtered particles that were emitted from the target to be used in simulations was obtained by actually performing film formation on a measurement base material (lens) having the same shape as Sample 3.

Film formation is performed under similar conditions to those of Example 3 while the inclination angle θ of the magnet 24 is locked at 0°. As a result, the film thickness exhibits an extremely large distribution of ±66%.

It is verified from Examples and Comparative Example that, when the film forming apparatus and film forming method according to the present invention are used, a uniform film with less film thickness nonuniformity in a lens surface having a large half-aperture angle is formed irrespective of whether the lens surface is a concave surface or a convex surface. Some Examples are described; however, the present invention is not limited to the above-described Examples, and may be modified as needed without departing from the purport of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-126321, filed Jul. 2, 2018, which is hereby incorporated by reference herein in its entirety.

What is claimed is:

1. A film forming apparatus comprising:
   a base material support mechanism configured to rotate a base material supported by the base material support mechanism about a first rotation axis;
   a first cathode portion configured to rotate a target in a first cylindrical shape about a second rotation axis; and
   a second cathode portion configured to rotate a target in a second cylindrical shape about a third rotation axis, wherein
   the second rotation axis and the third rotation axis are disposed at positions skewed with respect to the first rotation axis,
   a relation of Ma<Mb is satisfied, where Ma is a distance between the second rotation axis and a base material support surface of the base material support mechanism in a direction in which the first rotation axis extends and Mb is a distance between the third rotation axis and the base material support surface of the base material support mechanism in the direction in which the first rotation axis extends, and
   a relation of La>Lb is satisfied, where La is a distance between the first rotation axis and the second rotation axis when viewed in the direction in which the first rotation axis extends and Lb is a distance between the first rotation axis and the third rotation axis when viewed in the direction in which the first rotation axis extends, and
   wherein, when viewed in the direction in which the first rotation axis extends, R is a radius of a circle drawn by points farthest from the first rotation axis within a film-formed surface of the base material supported by the base material support mechanism, the distance La between the first rotation axis and the second rotation axis is greater than or equal to R.

2. The film forming apparatus according to claim 1, wherein
   the distance Lb between the first rotation axis and the third rotation axis is greater than or equal to ½ R.

3. The film forming apparatus according to claim 1, wherein
   each of a width in a direction of the second rotation axis of a target mounted region of the first cathode portion and a width in a direction of the third rotation axis of a target mounted region of the second cathode portion is greater than 2R.

4. The film forming apparatus according to claim 1, wherein
   each of a width in a direction of the second rotation axis of a target mounted region of the first cathode portion and a width in a direction of the third rotation axis of a target mounted region of the second cathode portion is less than 2R.

5. The film forming apparatus according to claim 1, wherein
   the first cathode portion includes a magnet along the second rotation axis and the second cathode portion includes a magnet along the third rotation axis, and
   an inclination angle of the magnets with respect to the direction in which the first rotation axis extends is adjustable.

6. The film forming apparatus according to claim 5, wherein
   the inclination angle of the magnet of the first cathode portion with respect to the direction in which the first rotation axis extends and the inclination angle of the magnet of the second cathode portion with respect to the direction in which the first rotation axis extends are individually adjustable.

7. The film forming apparatus according to claim 1, further comprising:
   a chamber in which is disposed at least one of the base material support mechanism, the first cathode portion, and the second cathode portion.

8. The film forming apparatus according to claim 6, further comprising:
   a controller, wherein
   the controller is configured to individually adjust the inclination angles of the magnets of the first and second cathode portions with respect to the direction in which the first rotation axis extends, according to a disposition and shape of the base material to be mounted on the base material support mechanism.

9. The film forming apparatus according to claim 5, wherein
   each of the magnet of the first cathode portion and the magnet of the second cathode portion is divided into multiple magnet pieces and disposed along the second rotation axis of the first cathode portion and the third rotation axis of the second cathode portion, respectively and
   the film forming apparatus further comprises a mechanism configured to adjust a position of each of the divided magnet pieces in a direction perpendicular to the second and third rotation axes.

10. The film forming apparatus according to claim 9, further comprising:
    a controller, wherein
    the controller is configured to adjust the position of each of the divided magnet pieces in the direction perpendicular to the second and third rotation axes, according to a disposition and shape of the base material to be mounted on the base material support mechanism.

11. A film forming method that uses the film forming apparatus according to claim 8, the method comprising:
    acquiring, by the controller, a shape and disposition of the base material to be mounted on the base material support mechanism;

acquiring, by the controller, an inclination angle of each of the magnets of the first and second cathode portions with respect to the direction in which the first rotation axis extends; and adjusting, by the controller, a position of each of the magnets of the first and second cathode portions, according to the acquired inclination angle.

12. A method of manufacturing a lens, the method comprising:

preparing a base material;

mounting the base material on a base material support mechanism and rotating the base material about a first rotation axis;

rotating a first cathode portion about a second rotation axis disposed at a position skewed with respect to the first rotation axis, and rotating a second cathode portion about a third rotation axis parallel to the second rotation axis;

forming a film made of a material of the first target and a material of the second target on the base material by applying voltage to the first cathode portion and the second cathode portion, wherein a relation of Ma<Mb is satisfied, where Ma is a distance between the second rotation axis and a base material support surface of the base material support mechanism in a direction in which the first rotation axis extends and Mb is a distance between the third rotation axis and the base material support surface of the base material support mechanism in the direction in which the first rotation axis extends, and a relation of La>Lb is satisfied, where La is a distance between the first rotation axis and the second rotation axis when viewed in the direction in which the first rotation axis extends and Lb is a distance between the first rotation axis and the third rotation axis when viewed in the direction in which the first rotation axis extends, and wherein, when viewed in the direction in which the first rotation axis extends, R is a radius of a circle drawn by points farthest from the first rotation axis within a film-formed surface of the base material supported by the base material support mechanism, the distance La between the first rotation axis and the second rotation axis is greater than or equal to R.

13. The method according to claim 12, wherein the distance Lb between the first rotation axis and the third rotation axis is greater than or equal to ½ R.

14. The method according to claim 12, wherein each of a width in a direction of the second rotation axis of a target mounted region of the first cathode portion and a width in a direction of the third rotation axis of a target mounted region of the second cathode portion is greater than 2R.

15. The method according to claim 12, wherein each of a width in a direction of the second rotation axis of a target mounted region of the first cathode portion and a width in a direction of the third rotation axis of a target mounted region of the second cathode portion is less than 2R.

16. The method according to claim 12, wherein the first cathode portion includes a magnet along the second rotation axis and the second cathode portion includes a magnet along the third rotation axis, and an inclination angle of the magnets with respect to the direction in which the first rotation axis extends is adjustable.

17. The method according to claim 16, wherein the inclination angle of the magnet of the first cathode portion with respect to the direction in which the first rotation axis extends and the inclination angle of the magnet of the second cathode portion with respect to the direction in which the first rotation axis extends are individually adjustable.

18. The method according to claim 16, wherein each of the magnet of the first cathode portion and the magnet of the second cathode portion is divided into multiple magnet pieces and disposed along the second rotation axis of the first cathode portion and the third rotation axis of the second cathode portion, respectively and the film forming apparatus further comprises a mechanism configured to adjust a position of each of the divided magnet pieces in a direction perpendicular to the second and third rotation axes.

19. The method according to claim 12, wherein the first cathode portion and the second cathode portion are arranged adjacent to each other.

20. The film forming apparatus according to claim 1, wherein the first cathode portion and the second cathode portion are arranged adjacent to each other.

* * * * *